(12) United States Patent
Ahn et al.

(10) Patent No.: US 9,793,118 B2
(45) Date of Patent: Oct. 17, 2017

(54) METHOD AND APPARATUS FOR TREATING SUBSTRATE

(71) Applicant: SEMES CO., LTD., Cheonan-si, Chungcheongnam-do (KR)

(72) Inventors: Eun Saem Ahn, Incheon (KR); Choongki Min, Cheonan-si (KR); Jung Yul Lee, Cheongju-si (KR); Min Jung Park, Daegu (KR)

(73) Assignee: Semes Co., Ltd., Chungcheongnam-do (KR)

( * ) Notice: Subject to any disclaimer, the term of this patent is extended or adjusted under 35 U.S.C. 154(b) by 0 days.

(21) Appl. No.: 15/078,249

(22) Filed: Mar. 23, 2016

(65) Prior Publication Data

US 2016/0293404 A1 Oct. 6, 2016

(30) Foreign Application Priority Data

Mar. 31, 2015 (KR) .......................... 10-2015-004556

(51) Int. Cl.
| | |
|---|---|
| *H01L 21/00* | (2006.01) |
| *H01L 21/027* | (2006.01) |
| *B05B 1/16* | (2006.01) |
| *B05B 7/00* | (2006.01) |
| *B05B 13/02* | (2006.01) |

(52) U.S. Cl.
CPC ............ H01L 21/0273 (2013.01); B05B 1/16 (2013.01); B05B 7/00 (2013.01); B05B 13/0242 (2013.01); B05B 13/0278 (2013.01)

(58) Field of Classification Search
CPC ......... H01L 21/0273; B05B 1/16; B05B 7/00; B05B 13/0242; B05B 13/027
See application file for complete search history.

(56) References Cited

U.S. PATENT DOCUMENTS

| | | | |
|---|---|---|---|
| 8,940,649 B2* | 1/2015 | Yoshihara | ........... H01L 21/6715 438/782 |
| 2009/0226615 A1* | 9/2009 | Nakazawa | .............. B05C 11/08 427/256 |

FOREIGN PATENT DOCUMENTS

| | | |
|---|---|---|
| JP | 2013-230468 A | 11/2013 |
| KR | 20090125097 A | 12/2009 |
| KR | 2012/0010121 A | 2/2012 |
| KR | 10-2014-0035252 | 3/2014 |
| KR | 10-1443945 B1 | 9/2014 |

(Continued)

*Primary Examiner* — Richard Booth
(74) *Attorney, Agent, or Firm* — Harness, Dickey & Pierce, P.L.C.

(57) ABSTRACT

Disclosed are a method and an apparatus for applying a liquid onto a substrate. The method for treating a substrate, the method includes: a liquid supplying step of supplying a treatment liquid for forming a liquid film on the substrate while rotating the substrate; and a liquid diffusing step of diffusing the treatment liquid discharged to the substrate by rotating the substrate, after the liquid supplying step. The liquid diffusing step includes: a primary diffusion step of rotating the substrate at a first diffusion speed; and a secondary diffusion step of rotating the substrate at a second diffusion speed, after the primary diffusion step. The second diffusion speed is higher than the first diffusion speed. Accordingly, the treatment liquid can be applied to the substrate again by performing the secondary diffusion step, making it possible to adjust the thickness of a photosensitive film.

15 Claims, 11 Drawing Sheets

(56) References Cited

FOREIGN PATENT DOCUMENTS

| | | | |
|---|---|---|---|
| KR | 10-1447759 | B1 | 10/2014 |
| KR | 2015/0027669 | A | 3/2015 |
| KR | 10-1509595 | B1 | 4/2015 |
| KR | 10-1597848 | B1 | 2/2016 |

* cited by examiner

METHOD AND APPARATUS FOR TREATING SUBSTRATE

CROSS-REFERENCE TO RELATED APPLICATIONS

A claim for priority under 35 U.S.C. §119 is made to Korean Patent Application No. 10-2015-0045566 filed Mar. 31, 2015, in the Korean Intellectual Property Office, the entire contents of which are hereby incorporated by reference.

BACKGROUND

Embodiments of the inventive concepts described herein relate to a method and an apparatus for supplying a liquid to a substrate, and more particularly to a method and an apparatus for applying a liquid onto a substrate.

Various processes such as cleaning, deposition, photographing, etching, and ion implantation are performed to manufacture a semiconductor device. Among the processes, in the photographing process, application, exposure, and development steps are sequentially performed. The application process is a process of applying a photosensitive liquid such as a resist onto a surface of a substrate. The exposure process is a process of exposing a circuit pattern on a substrate in which a photosensitive film is formed. The development process is a process of selectively developing an exposed area of a substrate.

In general, the application process requires a photosensitive film having a uniform thickness on a substrate. Accordingly, a photosensitive liquid is supplied to a central location of a substrate while the substrate is rotated. The photosensitive liquid supplied to the center of the substrate is diffused to the entire area of the substrate by a centrifugal force.

However, the photosensitive film formed on the substrate has different thicknesses in different areas. In particular, the thickness of the photosensitive film becomes thinner as it goes from the center to a periphery of the substrate, which causes an inferiority of the application process.

SUMMARY

Embodiments of the inventive concepts provide a method and an apparatus by which areas of a photosensitive film formed on a substrate have a uniform thickness.

Embodiments of the inventive concepts also provide a method and an apparatus by which a photosensitive film is sufficiently supplied to a peripheral area of a substrate.

One aspect of embodiments of the inventive concept is directed to providing A method for treating a substrate, the method including a liquid supplying step of supplying a treatment liquid for forming a liquid film on the substrate while rotating the substrate, and a liquid diffusing step of diffusing the treatment liquid discharged to the substrate by rotating the substrate, after the liquid supplying step, and the liquid diffusing step includes a primary diffusion step of rotating the substrate at a first diffusion speed, and a secondary diffusion step of rotating the substrate at a second diffusion speed, after the primary diffusion step, and and the second diffusion speed is higher than the first diffusion speed.

The first diffusion speed may be 500 RPM to 2000 RPM, and the second diffusion speed may be 900 RPM to 3000 RPM. The liquid diffusing step may further include a reflow step of reflowing the treatment liquid by rotating the substrate, between the primary diffusion step and the secondary diffusion step, and in the reflow step, the rotational speed of the substrate may be lower than the first diffusion speed. The first diffusion speed may be 500 RPM to 2000 RPM, the second diffusion speed may be 900 RPM to 3000 RPM, and in the reflow step, the substrate may be rotated at 0 RPM to 500 RPM.

The method may further include an intermediate step of stopping supplying the treatment liquid, between the liquid supplying step and the liquid diffusing step, and in the intermediate step, the substrate may be rotated at a third supply speed that is lower than the second supply speed. The first diffusion speed may be 500 RPM to 2000 RPM, the second diffusion speed may be 900 RPM to 3000 RPM, and the second supply speed may be 50 RPM to 1000 RPM. The first diffusion speed and the second diffusion speed may be higher than the second supply speed.

The liquid supplying step may include a first supply step of supplying the treatment liquid to the substrate while rotating the substrate at a first supply speed, and a second supply step of supplying the treatment liquid to the substrate while rotating the substrate at a second supply speed, and the liquid diffusing step may further include a reflow step of reflowing the treatment liquid by rotating the substrate at a speed lower than the first diffusion speed, between the primary diffusion step and the secondary diffusion step, and an intermediate step of stopping supplying the treatment liquid and rotating the substrate at a third supply speed that is lower than the second supply speed, between the liquid supplying step and the liquid diffusing step, and the first diffusion speed and the second diffusion speed may be higher than the second supply speed, the first diffusion speed may be 500 RPM to 2000 RPM, the second diffusion speed may be 900 RPM to 3000 RPM, the second supply speed may be 50 RPM to 1000 RPM, the third supply speed may be 0 RPM to 200 RPM, and in the reflow step, the substrate may be rotated at 0 RPM to 500 RPM.

In the first supply step, the treatment liquid may be supplied while the supply location of the treatment liquid is moved from an eccentric location spaced apart from the center of the substrate to the center of the substrate, and in the second supply step, the treatment liquid may be supplied to the center of the substrate. The treatment liquid may include a photosensitive liquid.

Another aspect of embodiments of the inventive concept is directed to providing an apparatus for treating a substrate, the apparatus including a substrate supporting member that supports the substrate, a rotation driving member that rotates the substrate supporting member, a liquid supplying unit that supplies a liquid onto the substrate supported by the substrate supporting member, and a controller that controls the rotation driving member and the liquid supplying unit, to controller may sequentially perform a liquid supplying process of supplying a liquid for forming a liquid film onto the rotated substrate and a liquid diffusing process of diffusing the liquid discharged to the substrate, and in the liquid diffusing process, the controller controls the rotation driving member such that a first diffusion process of rotating the substrate at a first diffusion speed and a second diffusion process of rotating the substrate at a second diffusion speed that is higher than the first diffusion speed.

The controller may control the rotation driving member such that a reflow process of reflowing the liquid by rotating the substrate at a speed lower than the first diffusion speed between the first diffusion process and the second diffusion process. The controller may control the rotation driving member such that a first supply process of supplying the treatment liquid while rotating the substrate at a first supply speed and a second supply process of supplying the treatment liquid while rotating the substrate at a second supply speed that is lower than the first supply speed are sequentially performed, in the liquid supplying process. The liquid supplying unit may include an arm, a treatment liquid nozzle supported by the arm to supply the treatment liquid, a prewet nozzle supported by the arm to supply a prewet liquid, and a guide member that moves the arm, and the treatment nozzle and the prewet nozzle may be arranged in a direction that is parallel to a direction in which the arm is moved, when viewed from the top, and the controller controls the guide member such that the treatment liquid supply location of the first supply process is moved from an eccentric location spaced apart from the center of the substrate to the center of the substrate, and the treatment liquid supply location of the second supply process is the center of the substrate.

Still another aspect of embodiments of the inventive concept is directed to providing a method for treating a substrate, the method including a liquid supplying step of supplying a photosensitive liquid for forming a photosensitive film on the substrate while rotating the substrate, and a liquid diffusing step of diffusing the photosensitive liquid discharged to the substrate by rotating the substrate, after the liquid supplying step, and the liquid diffusing step further includes a primary diffusion step of rotating the substrate at a first diffusion speed, a reflow step of reflowing the photosensitive liquid by rotating the substrate at a speed lower than the first diffusion speed, and a secondary diffusion step of rotating the substrate at a second diffusion speed that is higher than the first diffusion speed.

The first diffusion speed may be 500 RPM to 2000 RPM.

The second diffusion speed may be 900 RPM to 3000 RPM.

In the reflow step, the substrate may be rotated at 0 RPM to 500 RPM. The liquid supplying step may include a first supply step of supplying the photosensitive liquid to the substrate while rotating the substrate at a first supply speed, and a second supply step of supplying the photosensitive liquid to the substrate while rotating the substrate at a second supply speed that is lower than the first supply speed, the first diffusion speed, and the second diffusion speed, and the method further includes an intermediate step of stopping supplying the photosensitive liquid and rotating the substrate at a third supply speed that is lower than the second supply speed, between the liquid supplying step and the liquid diffusing step. The second supply speed may be 50 RPM to 1000 RPM, and the third supply speed may be 0 RPM to 200 RPM. In the first supply step, the photosensitive liquid may be supplied while the supply location of the photosensitive liquid is moved from an eccentric location spaced apart from the center of the substrate to the center of the substrate, and in the second supply step, the photosensitive liquid may be supplied to the center of the substrate.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, exemplary embodiments of the inventive concept will be described in more detail with reference to the accompanying drawings. The embodiments of the inventive concept may be modified in various forms, and the scope of the inventive concept should not be construed to be limited to the following embodiments. The embodiments of the inventive concept are provided to describe the inventive concept for those skilled in the art more completely. Accordingly, the shapes of the components of the drawings are exaggerated to emphasize clearer description thereof.

The facility of the present embodiment of the inventive concept may be used to perform a photography process on a substrate such as a semiconductor wafer or a flat display panel. In particular, the facility of the present embodiment may be connected to an exposure apparatus to perform an application process and a development process on a substrate. Hereinafter, a case of using a wafer as a substrate may be described as an example.

Hereinafter, a substrate treating facility according to the inventive concept will be described with reference to FIGS. 2 to 15.

Figure 1:
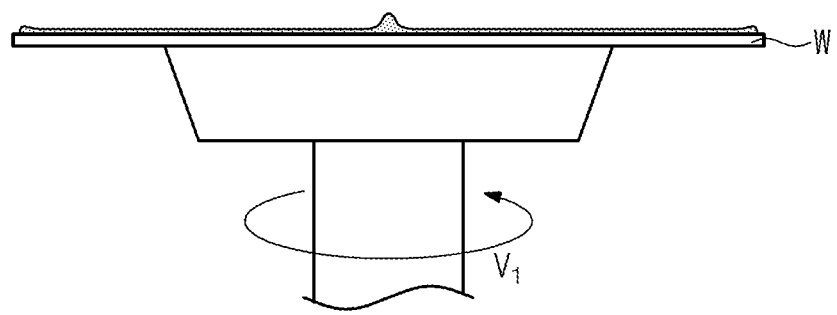
FIG. 1 is a sectional view illustrating a photosensitive film formed through a general application process.
Figure 2:
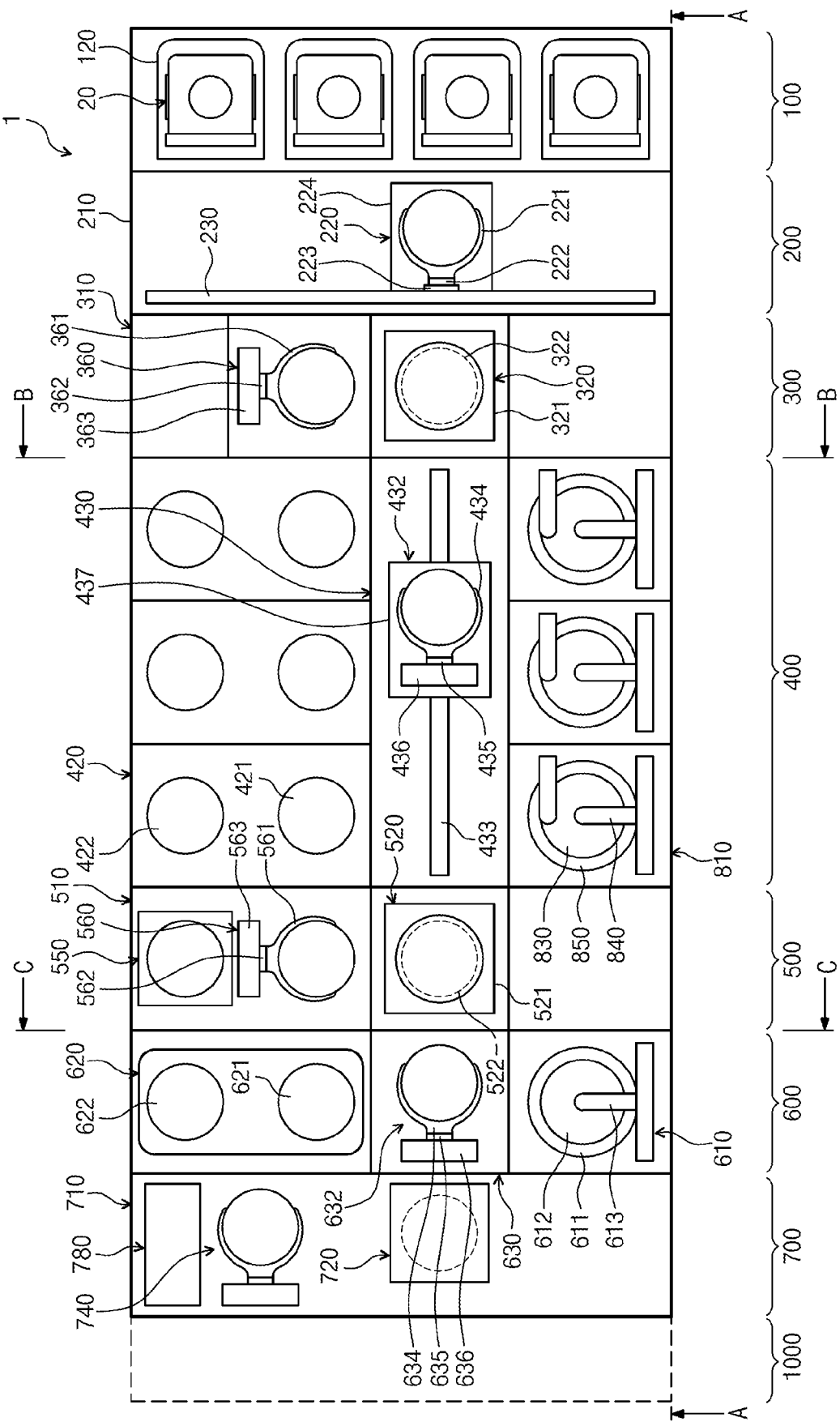
FIG. 2 is a plan view illustrating a substrate treating facility according to an embodiment of the inventive concept.

FIG. 2 is a view of the substrate treating facility, viewed from the top.

Figure 3:
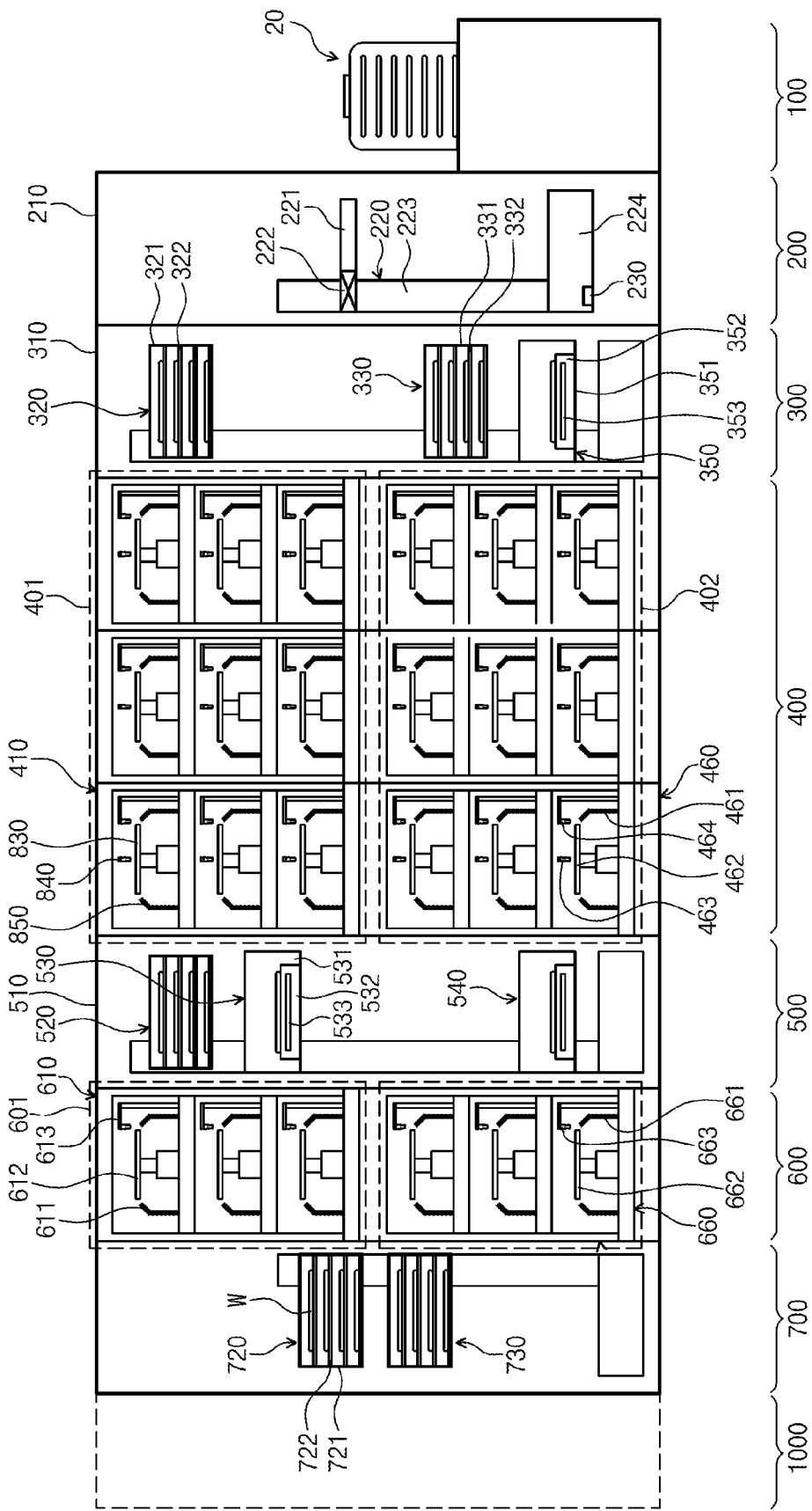
FIG. 3 is a sectional view of the facility of FIG. 2, taken along a line A-A of FIG. 2.

FIG. 3 is a sectional view of the facility of FIG. 2, taken along a line A-A of FIG. 2.

Figure 4:
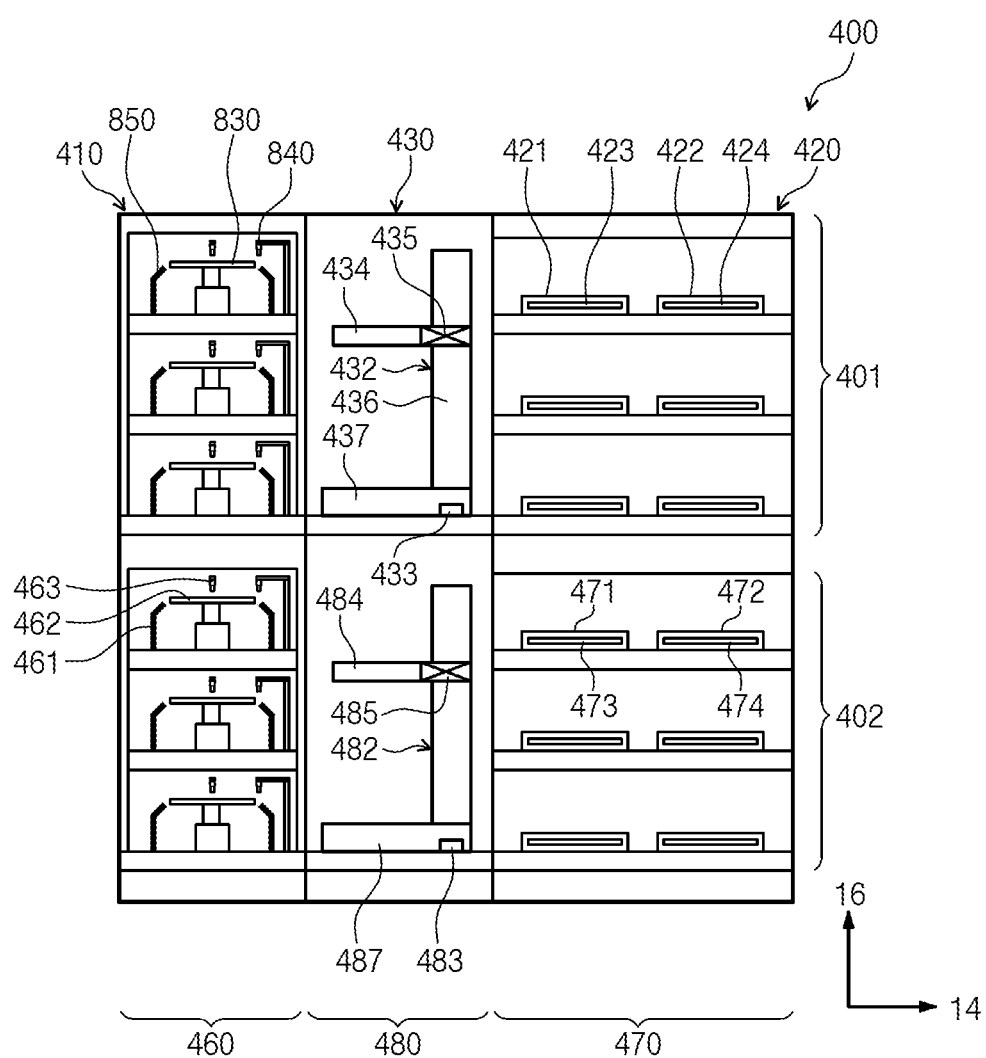
FIG. 4 is a sectional view of the facility of FIG. 2, taken along a line B-B of FIG. 2.

FIG. 4 is a sectional view of the facility of FIG. 2, taken along a line B-B of FIG. 2.

Figure 5:
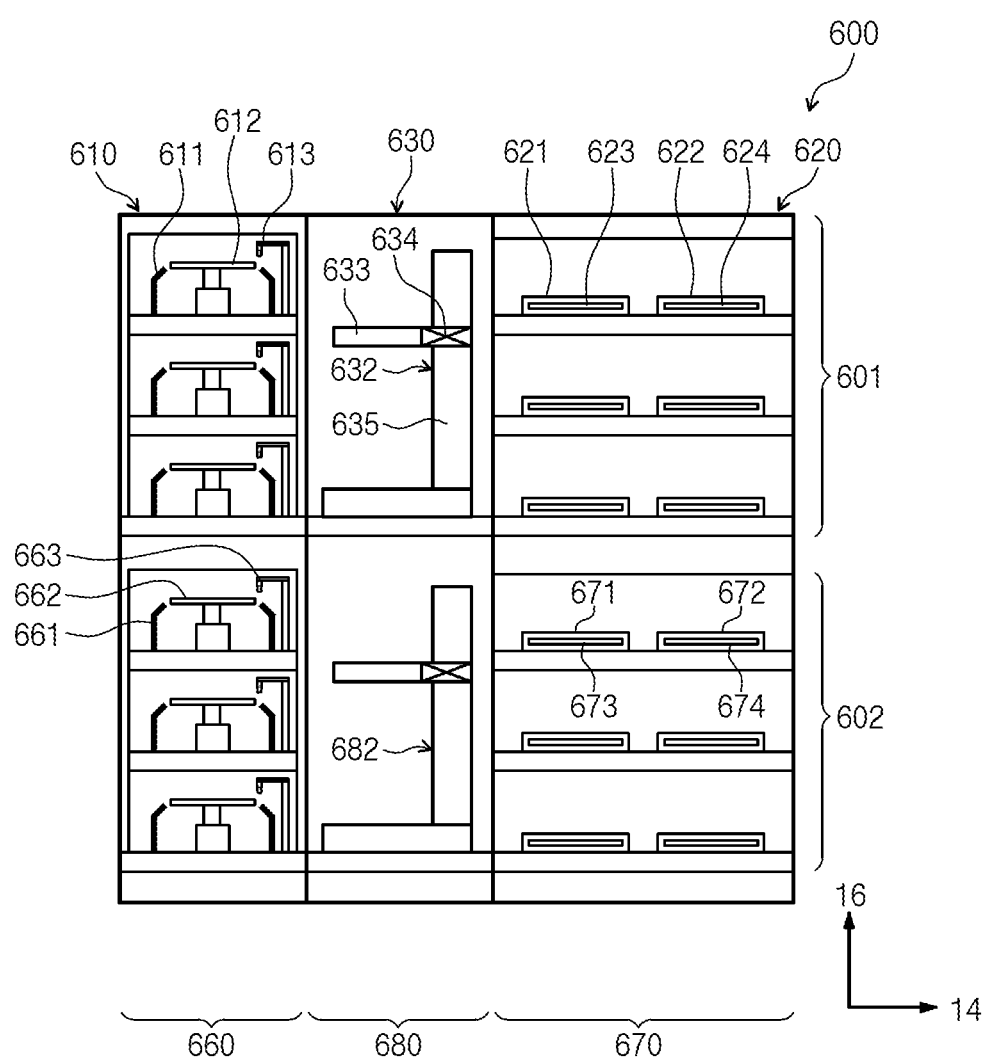
FIG. 5 is a sectional view of the facility of FIG. 2, taken along a line C-C of FIG. 2.

FIG. 5 is a sectional view of the facility of FIG. 2, taken along a line C-C of FIG. 2.

Referring to FIGS. 2 to 5, the substrate treating facility 1 includes a load port 100, an index module 200, a first buffer module 300, an application/development module 400, a second buffer module 500, a pre/post-exposure treating module 600, and an interface module 700. The load port 100, the index module 200, the first buffer module 300, the application/development module 400, the second buffer module 500, the pre/post-exposure treating module 600, and the interface module 700 are sequentially disposed in a row in one direction.

Hereinafter, a direction in which the load port 100, the index module 200, the first buffer module 300, the application/development module 400, the second buffer module 500, the pre/post-exposure treating module 600, and the interface module 700 are disposed will be referred to as a first direction 12, and a direction that is perpendicular to the first direction 12 when viewed from the top will be referred to as a second direction 14, and a direction that is perpendicular to the first direction 12 and the second direction 14 will be referred to as a third direction 16.

A substrate W is moved while being received in a cassette 20. Then, the cassette 20 has a structure that is sealed from the outside. For example, a front open unified pod (FOUP) that has a door on the front side may be used as the cassette 20.

Hereinafter, the load port 100, the index module 200, the first buffer module 300, the application/development module 400, the second buffer module 500, the pre/post-exposure treating module 600, and the interface module 700 will be described in detail.

The load port 100 has a carrier 120 on which the cassette 20, in which the substrates W are received, is positioned. A plurality of carriers 120 are provided, and are disposed along the second direction 14 in a row. In FIG. 2, four carriers 120 are provided.

The index module 200 feeds a substrate W between the cassette 20 positioned on the carrier 120 of the load port 100 and the first buffer module 300. The index module 200 has a frame 210, an index robot 220, and a guide rail 230. The frame 210 has a substantially rectangular parallelepiped shape having an empty interior, and is disposed between the load part 100 and the first buffer module 300. The frame 210 of the index module 200 may have a height smaller than that of a frame 310 of the first buffer module 300, which will be described below. The index robot 220 and the guide rail 230 are disposed in the frame 210. The index robot 220 has a four-axis driven structure such that a hand 221 that directly handles a substrate W is movable and rotatable in the first direction 12, the second direction 14, and the third direction 16. The index robot 220 has a hand 221, an arm 222, a support 223, and a prop 224. The hand 221 is fixedly installed in the arm 222. The arm 222 has a flexible and rotatable structure. The support 223 is configured such that the lengthwise direction thereof is disposed along the third direction 16. The arm 222 is coupled to the support 223 to be movable along the support 223. The support 223 is fixedly coupled to the prop 224. The guide rail 230 is provided such that the lengthwise direction thereof is disposed along the second direction 14. The prop 224 is coupled to the guide rail 230 to be linearly movable along the guide rail 230. Although not illustrated, the frame 210 is further provided with a door opener that opens and closes a door of the cassette 20.

The first buffer module 300 has a frame 310, a first buffer 320, a second buffer 330, a cooling chamber 350, and a first buffer robot 360. The frame has a rectangular parallelepiped shape having an empty interior, and is disposed between the index module 200 and the application/development module 400. The first buffer 320, the second buffer 330, the cooling chamber 350, and the first buffer robot 360 are situated within the frame 310. The cooling chamber 350, the second buffer 330, and the first buffer 320 are disposed along the third direction 16 sequentially from the bottom. The first buffer 320 is situated at a height corresponding to an application module 401 of the application/development module 400, which will be described below, and the second buffer 330 and the cooling chamber 350 are situated at a height corresponding to a development module 402 of the application/development module 400, which will be described below. The first buffer robot 360 is spaced apart by a predetermined distance in the second direction 14 from the second buffer 330, the cooling chamber 350, and the first buffer 320.

The first buffer 320 and the second buffer 330 temporarily preserve a plurality of substrates W. The second buffer 330 has a housing 331 and a plurality of supports 332. The supports 332 are disposed within the housing 331, and are spaced apart from one another along the third direction 16. One substrate W is positioned on each of the supports 332. The housing 331 has openings (not illustrated) on a side on which the index robot 220 is provided, on a side on which the first buffer robot 360 is provided, and on a side on which a development robot 482 is provided so that the index robot 220, the first buffer robot 360, and a development robot 482 of the development module 402, which will be described below, carry a substrate W into or out of the support 332 in the housing 331. The first buffer 320 has a structure that is substantially similar to that of the second buffer 330. Meanwhile, the housing 321 of the first buffer 320 has an opening on a side on which the first buffer robot 360 is provided and on a side on which an application robot 432 situated in the application module 401, which will be described below, is provided. The number of supports 322 provided for the first buffer 320 and the number of supports 332 provided for the second buffer 330 may be the same or different. According to an embodiment, the number of the supports 332 provided for the second buffer 330 may be larger than the number of the supports 332 provided for the first buffer 320.

The buffer robot 360 feeds a substrate W between the first buffer 320 and the second buffer 330. The first buffer robot 360 has a hand 361, an arm 362, and a support 363. The hand 361 is fixedly installed in the arm 362. The arm 362 has a flexible structure, and allows the hand 361 to be moved along the second direction 14. The arm 362 is coupled to the support 363 to be linearly movable in the third direction 16 along the support 363. The support 363 has a length extending from a location corresponding to the second buffer 330 to a location corresponding to the first buffer 320. The support 363 may be provided to extend longer upwards or downwards. The first buffer robot 360 may be provided such that the hand 361 is simply two-axis driven along the second direction 14 and the third direction 16.

The cooling chamber 350 cools a substrate W. The cooling chamber 350 has a housing 351 and a cooling plate 352. The cooling plate 352 has a cooling unit 353 that cools an upper surface thereof on which a substrate W is positioned and the substrate W. Various types such as a cooling type using cooling water and a cooling type using a thermoelectric element may be used as the cooling unit 353. A lift pin assembly (not illustrated) that locates a substrate W on the cooling plate may 352 be provided in the cooling chamber 350. The housing 351 has openings (not illustrated) on a side on which the index robot 220 is provided and on a side on which the development robot 482 is provided so that the index robot 220 and the development robot 482 provided for the development module 402, which will be described below, carry a substrate W into or out of the cooling plate 352. Doors (not illustrated) that open and close the aforementioned openings may be provided in the cooling chamber 350.

The application/development module 400 performs a process of applying a photoresist onto a substrate W before an exposure process and a process of developing the substrate W after the exposure process. The application/development module 400 has a substantially rectangular parallelepiped shape. The application/development module 400 has an application module 401 and a development module 402. The application module 401 and the development module 402 may be disposed to be partitioned from each other in different layers. According to an example, the application module 401 is situated on the development module 402.

The application module 401 performs a process of applying a photosensitive liquid such as a photoresist onto a substrate W and a heat treating process of, for example, heating and cooling the substrate W before and after the resist applying process. The application module 401 has a resist applying chamber 410, a bake chamber 420, and a carrying chamber 430. The resist applying chamber 410, the bake chamber 420, and the carrying chamber 430 are sequentially disposed along the second direction 14. Accordingly, the resist applying chamber 410 and the bake chamber 420 are spaced apart from each other in the second direction 14 while the carrying chamber 430 is interposed therebetween. A plurality of resist applying chambers 410 may be provided, and a plurality of resist applying chambers 410 may be provided in each of the first direction 12 and the third direction 16. In the drawings, six resist applying chambers 410 are illustrated as an example. A plurality of bake chamber 420 may be provided in each of the first direction 12 and the third direction 16. In the drawings, six bake chambers 420 are illustrated as an example. However, unlike this, a larger number of bake chambers 420 may be provided.

The carrying chamber 430 is situated in parallel to the first buffer 320 of the first buffer module 300 in the first direction 12. An application robot 432 and a guide rail 433 may be situated in the carrying chamber 430. The carrying chamber 430 has a substantially rectangular shape. The application robot 432 feeds a substrate W between the bake chambers 420, the resist applying chambers 400, the first buffer 320 of the first buffer module 300, and the first cooling chamber 520 of the second buffer module 500. The guide rail 433 is disposed such that the lengthwise direction thereof is parallel to the first direction 12. The guide rail 433 guides the application robot 432 such that the application robot 432 is linearly moved in the first direction 12. The application robot 432 has a hand 434, an arm 435, a support 436, and a prop 437. The hand 434 is fixedly installed in the arm 435. The arm 435 has a flexible structure such that the hand 443 is movable horizontally. The support 436 is provided such that the lengthwise direction thereof is disposed along the third direction 16. The arm 435 is coupled to the support 436 to be linearly movable in the third direction 16 along the support 436. The support 436 is fixedly coupled to the prop 437, and the prop 437 is coupled to the guide rail 433 to be movable along the guide rail 433.

Figure 6:
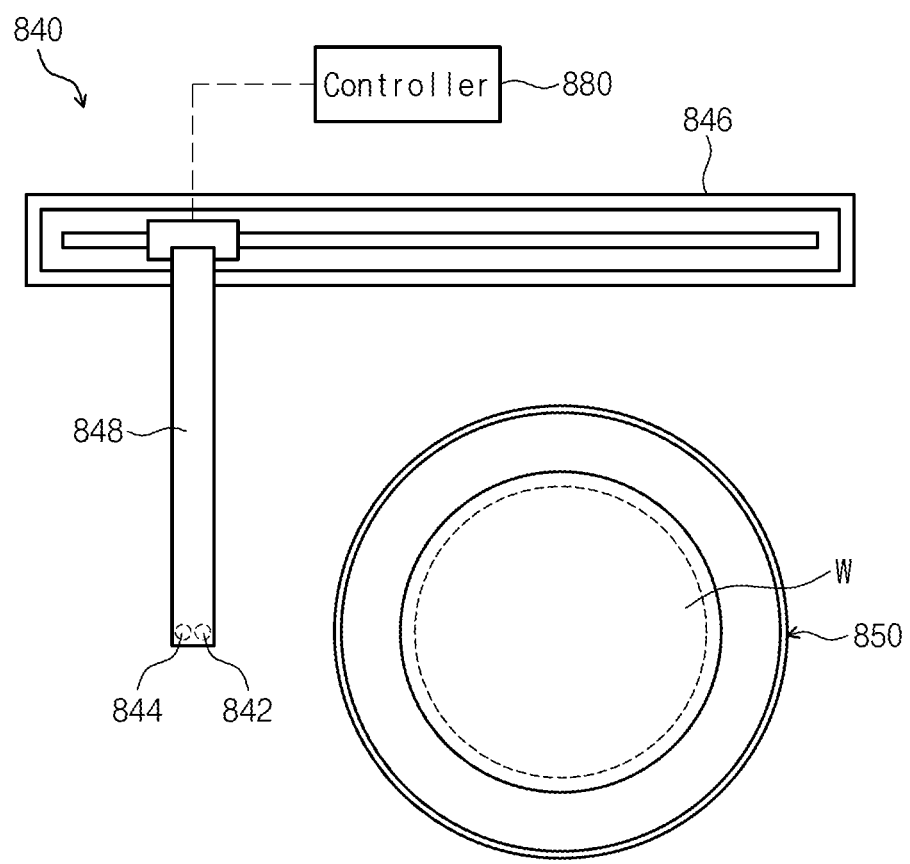
FIG. 6 is a plan view illustrating a substrate treating apparatus of FIG. 2.
Figure 7:
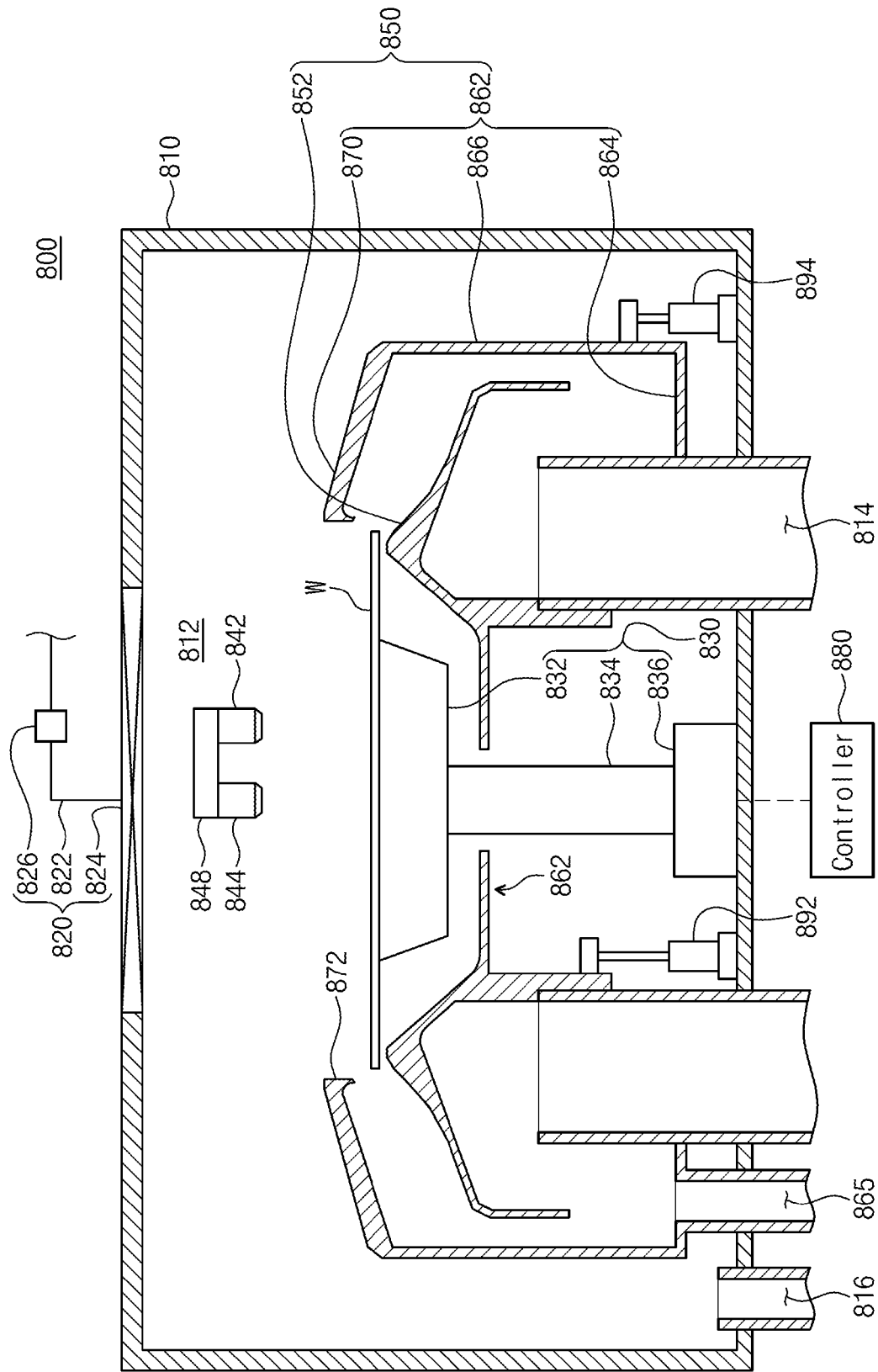
FIG. 7 is a sectional view illustrating the substrate treating apparatus of FIG. 2.
Figure 8:
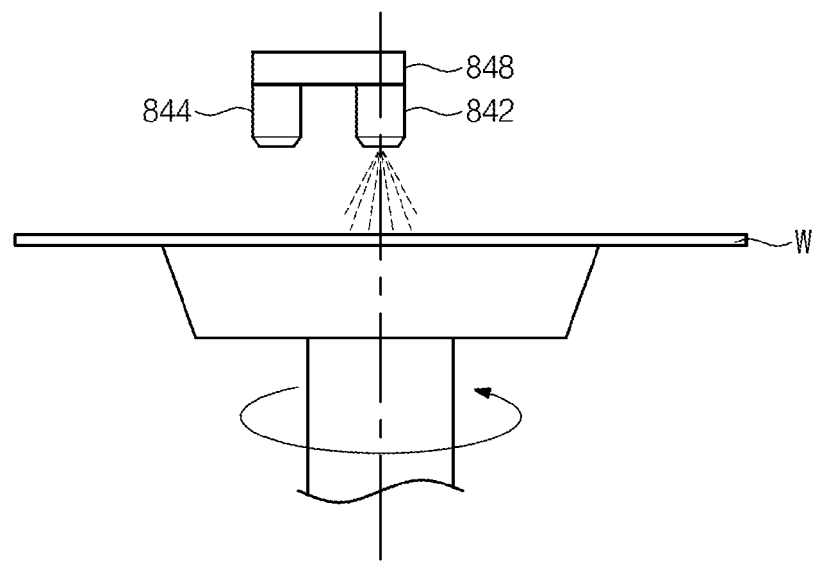
FIGS. 8 to 14 are sectional views illustrating a process of applying a treatment liquid to a substrate.
Figure 9:
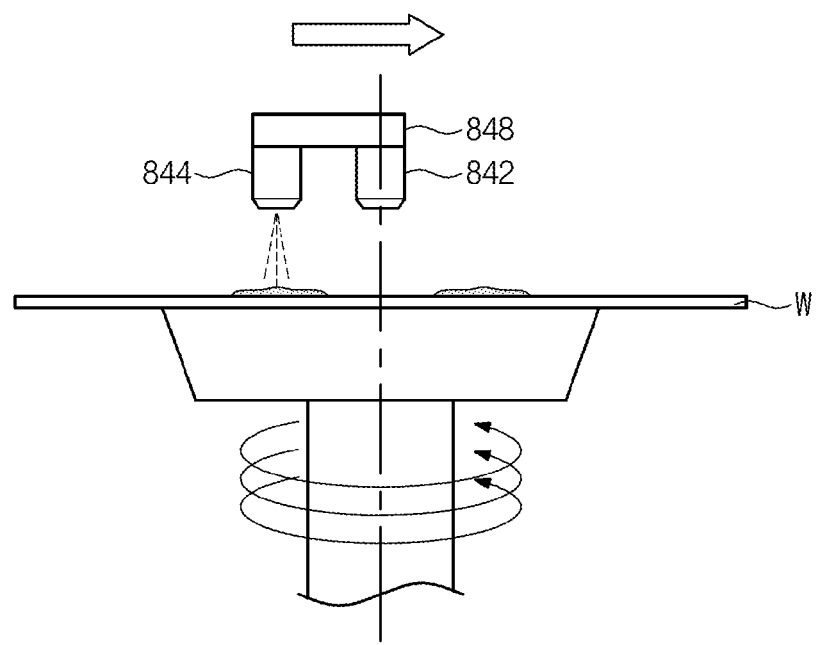
Figure 10:
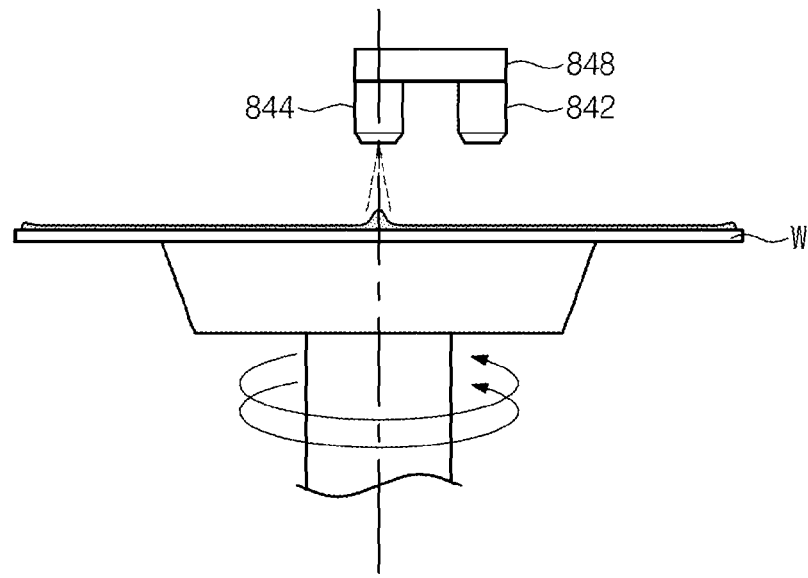
Figure 11:
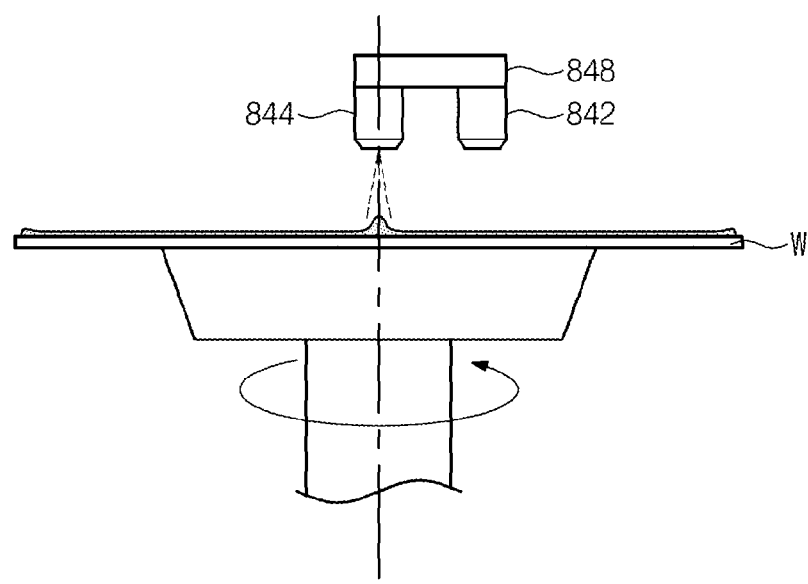
Figure 12:
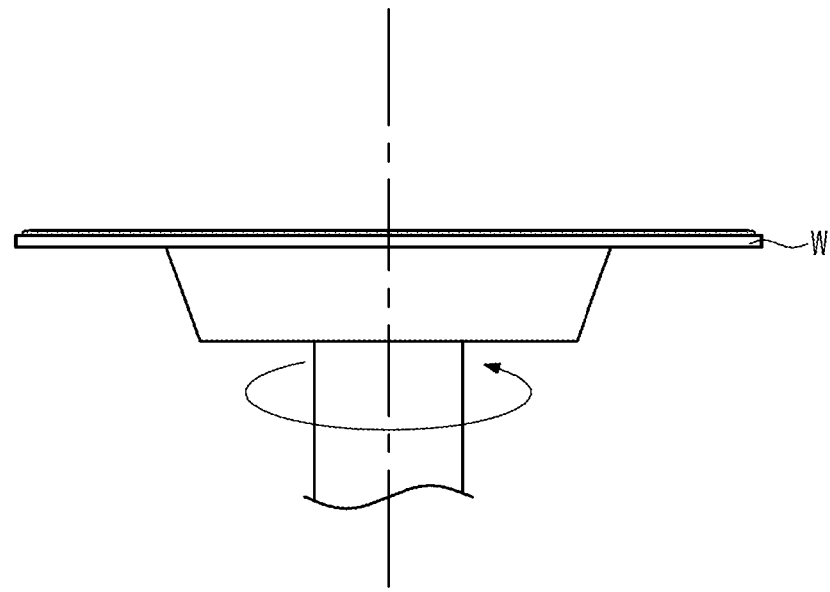
Figure 13:
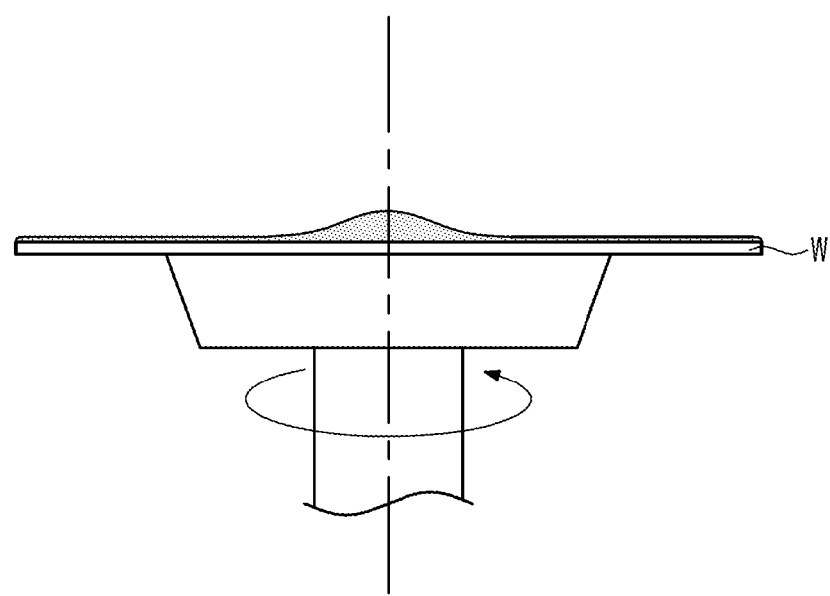
Figure 14:
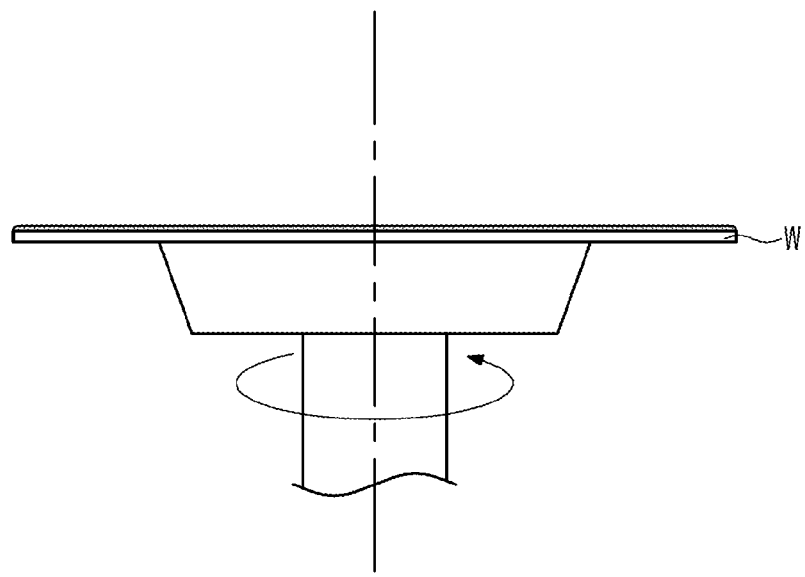

The resist applying chambers 410 have the same structure. However, the types of photoresists used in the resist applying chambers 410 may be different. As an example, the photoresist may be a chemical amplification resist. The resist applying chamber 410 is provided for a substrate treating apparatus that applies a photoresist onto the substrate W. The substrate treating apparatus 800 performs a liquid applying process. FIG. 6 is a plan view illustrating a substrate treating apparatus of FIG. 2. FIG. 7 is a sectional view illustrating the substrate treating apparatus of FIG. 2. Referring FIGS. 6 and 7, the substrate treating apparatus 800 includes a housing 810, an air current providing unit 820, a substrate supporting unit 830, a treatment container 850, an elevation unit 890, a liquid supplying unit 840, and a controller 880.

The housing 810 has a rectangular tub shape having a space 812 in the interior thereof. An opening (not illustrated) is formed on one side of the housing 810. The opening functions as a port through which a substrate W is carried in and out. A door is installed in the opening, and the door opens and closes the opening. If a substrate treating process is performed, the door interrupts the opening and closes the interior space 812 of the housing 810. An inner outlet 814 and an outer outlet 816 are formed on the lower surface of the housing 810. The air in the housing 810 is exhausted through the inner outlet 814 and the outer outlet 816. According to an example, the air provided for the treatment container 850 may be exhausted through the inner outlet 814, and the air provided for the outside of the treatment container 850 may be exhausted through the outer outlet 816.

The air current providing unit 820 forms a descending air current in the interior space of the housing 810. The air current providing unit 820 includes an air current supply line 822, a fan 824, and a filter 826. The air current supply line 822 is connected to the housing 810. The air current supply line 822 supplies exterior air into the housing 810. The filter 826 filters air provided from the air current supply line 822. The filter 826 eliminates impurities contained in the air. The fan 824 is installed on the upper surface of the housing 810. The fan 824 is situated at a central area of the upper surface of the housing 810. The fan 824 forms a descending air current in the interior space of the housing 810. If the air is supplied from the air current supply line 822 to the fan 824, the fan 824 supplies the air downwards.

The substrate supporting unit 830 supports the substrate W in the interior space of the housing 810. The substrate supporting unit 830 rotates the substrate W. The substrate supporting unit 830 includes a spin chuck 832, a rotary shaft 834, and a driver 836. The spin chuck 832 is provided for a substrate supporting member 832. The spin chuck 832 has a circular disk shape. The substrate W makes contact with the upper surface of the spin chuck 832. The spin chuck 832 has a diameter that is smaller than that of the substrate W. According to an example, the spin chuck 832 may vacuum-suction the substrate W and chuck the substrate W. Optionally, the spin chuck 832 may be provided for an electrostatic chuck that chucks the substrate W by using static electricity. The spin chuck 832 may chuck the substrate W by a physical force.

The rotary shaft 834 and the driver 836 are provided for rotation driving members 834 and 836 that rotate the spin chuck 832. The rotary shaft 834 supports the spin chuck 832 under the spin chuck 832. The rotary shaft 834 is provided such that the lengthwise direction thereof faces the upper and low sides. The rotary shaft 834 is provided to be rotatable about the central axis thereof. The driver 836 provides a driving force such that the rotary shaft 834 is rotated. For example, the driver 836 may be a motor that varies the rotational speed of the rotary shaft.

The treatment container 850 is situated in the interior space 812 of the housing 810. The treatment container 850 has a treatment space in the interior thereof. The treatment container 850 has an open-topped cup shape. The treatment container 850 includes an inner cup 852 and an outer cup 862.

The inner cup 852 has a circular disk shape that surrounds the rotary shaft 834. The inner cup 852 is situated to overlap the inner inlet 814 when viewed from the top. The upper surface of the inner cup 852 is provided such that an outer area and an inner area thereof have different angles when viewed from the top. According to an example, the outer area of the inner cup 852 is downwardly inclined as it goes away from the substrate support unit 830 and the inner area of the inner cup 852 is upwardly inclined as it goes away from the substrate support unit 830. A point where the outer area and the inner area of the inner cup 852 meet is provided to vertically correspond to a side end of the substrate W. The outer area of the upper surface of the inner cup 852 is rounded. The outer area of the upper surface of the inner cup 852 is concave. The outer area of the upper surface of the inner cup 852 may be provided as an area through which a treatment liquid flows.

The outer cup 862 has a cup shape that surrounds the substrate supporting unit 830 and the inner cup 852. The outer cup 862 has a bottom wall 864, a side wall 866, an upper wall 870, and an inclined wall 870. The bottom wall 864 has a hollow circular disk shape. A recovery line 865 is formed in the bottom wall 864. The recovery line 865 recovers a treatment liquid supplied onto the substrate W. The treatment liquid recovered by the recovery line 865 may be reused by an external liquid recycling system. The side wall 866 has a circular tub shape that surrounds the substrate supporting unit 830. The side wall 866 extends from a side end of the bottom wall 864 in a direction perpendicular to the bottom wall 864. The side wall 866 extends upwards from the bottom wall 864.

The inclined wall 870 extends from an upper end of the side wall 866 towards the inside of the outer cup 862. The inclined wall 870 is provided to become closer to the substrate supporting unit 830 as it goes upwards. The inclined wall 870 has a ring shape. An upper end of the inclined wall 870 is higher than the substrate W supported by the substrate supporting unit 830.

The elevation unit 890 elevates the inner cup 852 and the outer cup 862. The elevation unit 890 includes an inner movable member 892 and an outer movable member 894. The inner movable member 892 elevates the inner cup 852, and the outer movable member 894 elevates the outer cup 862.

The liquid supplying unit 840 supplies a treatment liquid and a prewet liquid onto the substrate W. The liquid supplying unit 840 includes a guide member 846, an arm 848, a prewet nozzle, and a treatment nozzle 844. The guide member 846 includes a guide rail 846 that moves the arm 848 horizontally. The guide rail 846 is situated on one side of the treatment container. The guide rail 846 is provided such that the lengthwise direction thereof is horizontal. According to an example, the lengthwise direction of the guide rail 846 may be in a direction parallel to the first direction. The arm 848 is installed in the guide rail 846. The arm 848 may be moved by a linear motor provided in the interior of the guide rail 846. The arm 848 may face the lengthwise direction that is perpendicular to the guide rail 846 when viewed from the top. One end of the arm 848 is mounted on the guide rail 846. A prewet nozzle 842 and a treatment nozzle 844 are installed on the bottom surface of an opposite end of the arm 848. The prewet nozzle 842 and the treatment nozzle 844 are arranged in a direction that is parallel to the lengthwise direction of the guide rail 846, when viewed from the top.

The prewet nozzle 842 supplies a prewet liquid onto the substrate W, and the treatment nozzle 844 supplies a treatment liquid onto the substrate W. For example, the prewet liquid may be a liquid that dilutes the treatment liquid. The prewet liquid may be thinner, and the treatment liquid may be a photosensitive liquid such as a photoresist. The prewet nozzle 842 receives a prewet liquid from a prewet liquid supply line. A first valve is installed in the prewet supply line, and the first valve opens and closes the prewet liquid supply line. The treatment nozzle 844 receives a treatment liquid from the treatment liquid supply line. A second valve is installed in the treatment liquid supply line, and the second valve opens and closes the treatment liquid supply line.

The prewet nozzle 842 supplies a prewet liquid to a central location of the substrate W, and the treatment nozzle 844 supplies a treatment liquid to a location between an eccentric location and the central location of the substrate W. The prewet nozzle 842 and the treatment nozzle 844 are provided such that discharge holes thereof face a vertically downward direction. Here, the central location is a location where the supply location of the liquid corresponds to the center of the substrate W, and the eccentric location is a location that is spaced from the center of the substrate W. Optionally, the discharge hole of the prewet nozzle 842 may face a downwardly inclined direction.

The controller 880 controls the driver 836, the guide member 846, the first valve, and the second valve. The controller 880 controls the guide member 846, the first valve, and the second valve such that the prewet process, the liquid supplying process, and the liquid diffusing process are sequentially performed. According to an example, the liquid supplying process may include a first supply process and a second supply process, and the liquid diffusing process may include a first diffusion process, a reflow process, and a second diffusion process. The controller 880 controls the driver such that the rotational speed of the substrate W varies according to the processes.

Figure 15:
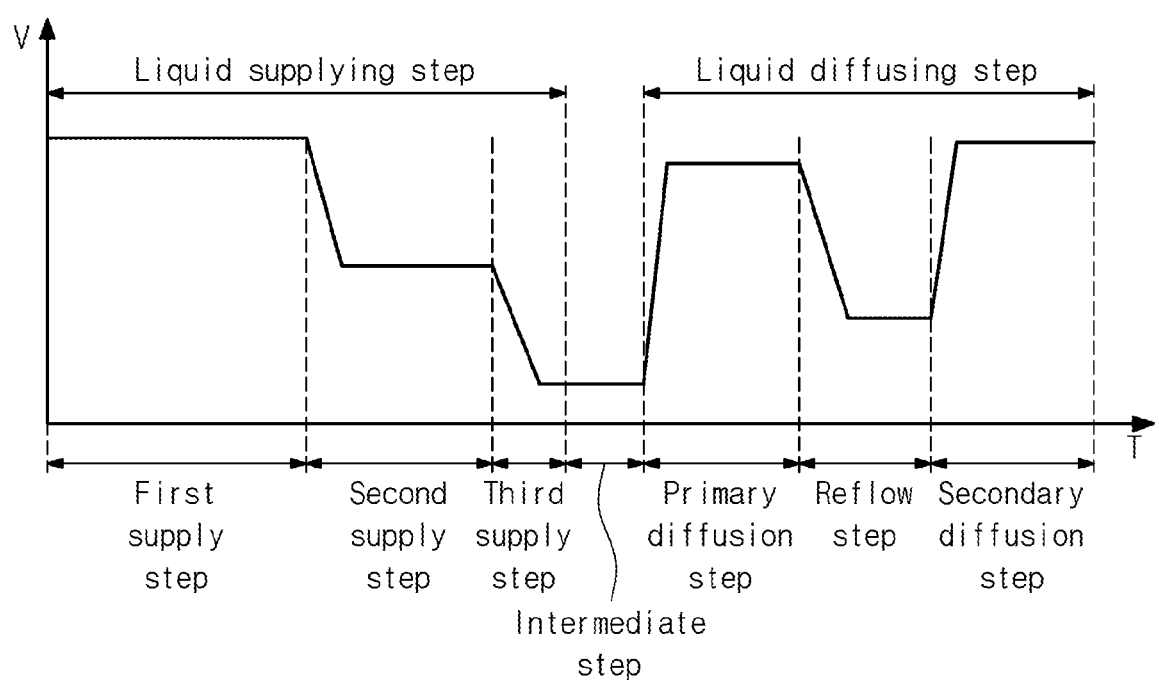
FIG. 15 is a view illustrating a rotational speed of a substrate varied according to the process of applying the treatment liquid in FIGS. 8 to 14.

Next, a method for applying a liquid to a substrate W by using the aforementioned substrate treating apparatus. FIGS. 8 to 14 are sectional views illustrating a process of applying a treatment liquid to a substrate. FIG. 15 is a view illustrating a rotational speed of a substrate varied according to the process of applying the treatment liquid in FIGS. 8 to 14. Referring to FIGS. 8 to 15, the method for applying a liquid to a substrate W include a prewet step, a liquid supplying step, an intermediate step, and a liquid diffusing step. The prewet step, the liquid supplying step, the intermediate step, and the liquid diffusing step are sequentially performed.

In the prewet step, a pre-wet liquid is supplied onto the substrate W. If the prewet step is performed, the substrate W is rotated and the prewet nozzle 842 is moved such that a prewet liquid is supplied to a central location thereof. The prewet nozzle 842 may be situated to face the center of the substrate W.—The prewet nozzle 842 discharges the prewet liquid to the center of the substrate W to convert the upper surface of the substrate W into a wet state. For example, the rotational speed of the substrate W in the prewet step may be lower than that in the liquid supplying step.

In the liquid supplying step, a treatment liquid is supplied onto the substrate W. The liquid supplying step includes a first supply step, a second supply step, and a third supply step. The first supply step, the second supply step, and the third supply step are sequentially performed. The locations where the liquid is supplied are different in the first supply step and the second supply step. The rotational speeds of the substrate W in the first supply step, the second supply step, and the third supply step are different. If the first supply step is performed, the treatment nozzle 844 is moved while the treatment liquid is discharged such that the supply location of the treatment liquid is changed from an eccentric location to a central location. The substrate W is rotated at a first supply speed. Because the treatment nozzle 844 is situated to face the eccentric location of the substrate W in the prewet step, it is not necessary to move the treatment nozzle 844 for discharging the treatment liquid to the eccentric location. However, the eccentric location to which the treatment liquid is discharged may be changed according to the size of the substrate W, a flow rate of discharged liquid, and a surrounding environment. Accordingly, if the first supply step is performed, the treatment nozzle 844 may be moved to discharge the treatment liquid to the eccentric location. If the supply location of the treatment liquid is moved from the eccentric location to the central location, the second supply step is performed.

In the second supply step, the supply location of the treatment nozzle 844 is provided at the central location and the substrate W is rotated not at the first supply speed but at the second supply speed. If the second supply step is completed, the third supply step is performed. In the third supply step, the substrate W is rotated at a third supply speed. According to an example, the second supply speed may be lower than the first supply speed, and the third supply speed may be lower than the second supply speed. The treatment liquid may be continuously discharged in a process of proceeding from the first supply step to the second supply step and a process of proceeding from the second supply step to the third supply step. The second supply speed may be 50 RPM to 1000 RPM, and the third supply speed may be 0 RPM to 200 RPM.

If the third supply step is completed, the intermediate step is performed. In the intermediate step, a standby step for processing from the liquid supplying step to the liquid diffusing step is provided. If the intermediate step is performed, the treatment nozzle 844 stops discharging the treatment liquid and maintains the rotational speed of the substrate W at the third supply speed.

In the liquid diffusing step, the treatment liquid discharged onto the substrate W is diffused. In the liquid diffusing step, the thickness of the treatment liquid film is adjusted such that areas of the treatment liquid film have a uniform thickness. In the liquid diffusing step, the entire thickness of the treatment liquid film is adjusted. The liquid diffusing step includes a first diffusion step, a reflow step, and a second diffusion step. The first diffusion step, the reflow step, and the second diffusion step are sequentially performed. If the first diffusion step is performed, the substrate W is rotated at a first diffusion speed. According to an embodiment, the first diffusion speed is higher than the second supply speed. The first diffusion speed may be 500 RPM to 2000 RPM. Accordingly, the treatment liquid is diffused at a locus larger than in the second supply step and is diffused to a peripheral area of the substrate W.

If the first diffusion step is completed, the reflow step is performed. In the reflow step, the substrate W is rotated at a speed that is lower than the first diffusion speed. According to an example, in the reflow step, the substrate W may be rotated at a speed lower than the second supply speed. In the reflow step, the substrate W may be rotated at 0 RPM to 500 RPM. Accordingly, the movement direction of the treatment liquid may face the center of the substrate W.

If the reflow step is completed, the second diffusion step is performed. In the second diffusion step, the substrate W is rotated at a second diffusion speed. According to an embodiment, the second diffusion speed is higher than the first diffusion speed. The second diffusion speed may be 900 RPM to 3000 RPM. Accordingly, the treatment liquid may be diffused at a locus larger than in the first diffusion step and may be applied to a peripheral area of the substrate W again.

It has been described in the present embodiment that the liquid diffusing step includes the first diffusion step, the reflow step, and the second diffusion step and the treatment liquid is diffused twice. However, the inventive concept is not limited thereto, but the treatment liquid may be diffused three times or more. In this case, a reflow step may be provided between the diffusion steps. For example, N (N is a natural number that is equal to or greater than 2) diffusion steps are provided, and (N−1) reflow steps may be provided.

Referring back to FIGS. 2 to 5, the bake chamber 420 heat-treats the substrate W. For example, the bake chambers 420 perform a prebake process of eliminating organic substances and moisture on the surface of the substrate W by heating the substrate W at a predetermined temperature before a photoresist is applied or a soft bake process performed after a photoresist is applied onto the substrate W, and performs a cooling process of cooling the substrate W after the heating processes. The bake chamber 420 has a cooling plate 421 and a heating plate 422. The cooling plate 421 is provided with a cooling unit 423 such as cooling water or a thermoelectric element. The heating plate 422 is provided with a heating unit 424 such as a heating wire or a thermoelectric element. The cooling plate 421 and the heating plate 422 may be provided in one bake chamber 420. Optionally, some of the bake chambers 420 may include only a cooling plate 421, and some of the bake chambers 422 may include only a heating plate 422.

The development module 402 includes a process of eliminating a photoresist by supplying a development liquid to obtain a pattern on the substrate W, and a heat treating process, such as heating and cooling, which are performed on the substrate W before and after the development process. The development module 402 has a development chamber 460, a bake chamber 470, and a carrying chamber 480. The development chamber 460, the bake chamber 470, and the carrying chamber 480 are sequentially disposed along the second direction 14. Accordingly, the development chamber 460 and the bake chamber 470 are spaced apart from each other in the second direction 14 while the carrying chamber 480 is interposed therebetween. A plurality of development chambers 460 may be provided, and a plurality of development chambers 460 may be provided in each of the first direction 12 and the third direction 16. In the drawings, six development chambers 460 are illustrated as an example. A plurality of bake chamber 470 may be provided in each of the first direction 12 and the third direction 16. In the drawings, six bake chambers 470 are illustrated as an example. However, unlike this, a larger number of bake chambers 470 may be provided.

The carrying chamber 480 is situated in parallel to the second buffer 330 of the first buffer module 300 in the first direction 12. A development robot 480 and a guide rail 482 may be situated in the carrying chamber 483. The carrying chamber 480 has a substantially rectangular shape. The development robot feeds the substrate W between the bake chambers 470, the development chambers 460, the second buffer 330 and the cooling chamber 350 of the first buffer module 300, and the second cooling chamber 540 of the second buffer module 500. The guide rail 483 is disposed such that the lengthwise direction thereof is parallel to the first direction 12. The guide rail 483 guides the development robot 482 such that the development robot 432 is linearly moved in the first direction 12. The development robot 482 has a hand 484, an arm 485, a support 486, and a prop 487. The hand 484 is fixedly installed in the arm 485. The arm 485 has a flexible structure such that the hand 484 is movable horizontally. The support 486 is provided such that the lengthwise direction thereof is disposed along the third direction 16. The arm 485 is coupled to the support 486 to be linearly movable in the third direction 16 along the support 486. The support 486 is fixedly coupled to the prop 487. The prop 487 is coupled to the guide rail 483 to be linearly movable along the guide rail 483.

The development chambers 460 have the same structure. However, the types of development liquids used in the development chambers 460 may be different. The development chambers 460 eliminate an area of the photoresist on the substrate W, to which light is irradiated. Then, an area of the protection film, to which light is irradiated, is eliminated together. Optionally, only an area of the photoresist and the protection film, to which light is not irradiated, may be eliminated according to the type of the used photoresist.

The development chamber 460 has a container 461, a support plate 462, and a nozzle 463. The container 461 has an open-topped cup shape. The support plate 462 is situated in the container 461, and supports the substrate W. The support plate 462 may be provided to be rotatable. The nozzle 463 supplies a development liquid onto the substrate W positioned on the support plate 462. The nozzle 463 may have a circular pipe shape, and may supply a development liquid to the center of the substrate W. Optionally, the nozzle 463 may have a length corresponding to the diameter of the substrate W, and the discharge hole of the nozzle 463 may be a slit. The development chamber 460 may be further provided with a nozzle 464 that supplies a cleaning liquid such as deionized water to clean the surface of the substrate, to which the development liquid is additionally supplied.

The bake chamber 470 heat-treats the substrate W. For example, the bake chambers 470 may perform a post bake process of heating the substrate W before the development process, a hard bake process of heating the substrate W after the development process, and a cooling process of cooling the heated substrate W after the bake process. The bake chamber 470 has a cooling plate 471 and a heating plate 472. The cooling plate 471 is provided with a cooling unit 473 such as cooling water or a thermoelectric element. The heating plate 472 is provided with a heating unit 474 such as a heating wire or a thermoelectric element. The cooling plate 471 and the heating plate 472 may be provided in one bake chamber 470. Optionally, some of the bake chambers 470 may include only a cooling plate 471, and some of the bake chambers 472 may include only a heating plate 422.

As described above, the application/development module 400 is provided such that the application module 401 and the development module 402 are separated. When viewed from the top, the application module 401 and the development module 402 may have the same chamber disposition.

The second buffer module 500 is provided as a passage through which the substrate W is transported, between the application/development module 400 and the pre/post-exposure module 600. The second buffer module 500 performs a process such as a cooling process or an edge exposing process on the substrate W. The second buffer module 500 has a frame 510, a buffer 520, a first cooling chamber 530, a second cooling chamber 540, an edge exposing chamber 550, and a second buffer robot 560. The frame 510 has a rectangular parallelepiped shape. The buffer 520, the first cooling chamber 530, the second cooling chamber 540, the edge exposing chamber 550, and the second buffer robot 560 are situated in the frame 510. The buffer 520, the first cooling chamber 530, and the edge exposing chamber 550 are disposed at a height corresponding to the application module 401. The second cooling chamber 540 is disposed at a height corresponding to the development module 402. The buffer 520, the first cooling chamber 530, and the second cooling chamber 540 are disposed in a row along the third direction 16. When viewed from the top, the buffer 520 is disposed along the carrying chamber 430 of the application module 401 in the first direction 12. The edge exposing chamber 550 is spaced apart from the buffer 520 or the first cooling chamber 530 by a predetermined distance in the second direction 14.

The second buffer robot 560 transports the substrate W between the buffer 520, the first cooling chamber 530, and the edge exposing chamber 550. The second buffer robot 560 is situated between the edge exposing chamber 550 and the buffer 520. The second buffer robot 560 may have a structure that is similar to that of the first buffer robot 360. The first cooling chamber 530 and the edge exposing chamber 550 perform a succeeding process on the substrate W, on which the application module 401 has performed a process. The first cooling chamber 530 cools the substrate W, on which the application module 401 has performed a process. The first cooling chamber 530 has a structure similar to that similar to that of the cooling chamber 350 of the first buffer module 300. The edge exposing chamber 550 exposes peripheries of the substrate W, on which the first cooling chamber 530 has performed a cooling process. The buffer 520 temporarily preserves the substrates W before the substrates W, on which the edge exposing chamber 550 has performed a process, are transported to a pre-treatment module 601, which will be described below. The second cooling chamber 540 cools the substrate W before the substrate W, on which a post-treatment module 602, which will be described below, has performed a process, are transported to the development module 402. The second buffer module 500 may further have a buffer at a height corresponding to the development module 402. In this case, the substrate W, on which the post-treatment module 602 has performed a process, may be transported to the development module 402 after being temporarily preserved in the added buffer.

When the exposure apparatus 900 performs an immersion/exposure process, the pre/post-exposure module 600 may perform a process of applying a protective film that protects the photoresist film applied to the substrate W during the immersion/exposure process. The pre/post-exposure module 600 may perform a process of cleaning the substrate W after the exposure process. Furthermore, when the application process is performed by using a chemical amplification resist, the pre/post-exposure module 600 may perform a bake process after the exposure process.

The pre/post-exposure module 600 has a pre-treatment module 601 and a post-treatment module 602. The pre-treatment module 601 performs a process of treating the substrate W before the exposure process, and the post-treatment module 602 performs a process of treating the substrate W after the exposure process. The pre-treatment module 601 and the post-treatment module 602 may be disposed to be partitioned from each other in different layers. According to an example, the pre-treatment module 601 is situated on the post-treatment module 602. The pre-treatment module 601 has the same height as that of the application module 401. The post-treatment module 602 has the same height as that of the development module 402. The pre-treatment module 601 has a protective film applying chamber 610, a bake chamber 620, and a carrying chamber 630. The protective film applying chamber 610, the carrying chamber 630, and the bake chamber 620 are sequentially disposed along the second direction 14. Accordingly, the protective film applying chamber 610 and the bake chamber 620 are spaced apart from each other in the second direction 14 while the carrying chamber 630 is interposed therebetween. A plurality of protective film applying chambers 610 are provided, and the plurality of protective film applying chambers 610 are disposed along the third direction 16 to form different layers. Optionally, a plurality of protective film applying chambers 610 may be provided in each of the first direction 12 and the third direction 16. A plurality of bake chambers 620 are provided, and the plurality of bake chambers 610 are disposed along the third direction 16 to form different layers. Optionally, a plurality of bake chambers 620 may be provided in each of the first direction 12 and the third direction 16.

The carrying chamber 630 is situated in parallel to the first cooling chamber 530 of the second buffer module 500 in the first direction 12. A pre-treatment robot 632 is situated in the carrying chamber 630. The carrying chamber 630 has a substantially square or rectangular shape. The pre-treatment robot 632 feeds the substrate W between the protective film applying chambers 610, the bake chambers 620, the buffer 520 of the second buffer module 500, and a first buffer 720 of the interface module 700, which will be described below. The pre-treatment robot 632 has a hand 633, an arm 634, and a support 635. The hand 633 is fixedly installed in the arm 634. The arm 634 has a flexible and rotatable structure. The arm 634 is coupled to the support 635 to be linearly movable in the third direction 16 along the support 635.

The protective film applying chamber 610 applies a protective film that protects a resist film during the immersion/exposure process, onto the substrate W. The protective film applying chamber 610 has a housing 611, a support plate 612, and a nozzle 613. The housing 611 has an open-topped cup shape. The support plate 612 is situated in the housing 611, and supports the substrate W. The support plate 612 may be provided to be rotatable. The nozzle 613 supplies a protection liquid for forming a protective film onto the substrate W positioned on the support plate 612. The nozzle 613 has a circular pipe shape, and may supply a protection liquid to the center of the substrate W. Optionally, the nozzle 613 may have a length corresponding to the diameter of the substrate W, and the discharge hole of the nozzle 463 may be a slit. In this case, the support plate 612 may be provided in a fixed state. The protection liquid includes an expandable material. The protection liquid may be a material that has a low affinity for a photoresist and water. For example, the protection liquid may include a fluorine-based solvent. The protective film applying chamber 610 supplies a protection liquid to a central area of the substrate W while rotating the substrate W positioned on the support plate 612.

The bake chamber 620 heat-treats the substrate W, to which the protective film is applied. The bake chamber 620 has a cooling plate 621 and a heating plate 622. The cooling plate 621 is provided with a cooling unit 623 such as cooling water or a thermoelectric element. The heating plate 622 is provided with a heating unit 624 such as a heating wire or a thermoelectric element. The heating plate 622 and the cooling plate 621 may be provided in one bake chamber 620. Optionally, some of the bake chambers 620 may include only a heating plate 622, and some of the bake chambers 621 may include only a cooling plate 422.

The post-treatment module 602 has a cleaning chamber 660, a post-exposure bake chamber 670, and a carrying chamber 680. The cleaning chamber 660, the carrying chamber 680, and the post-exposure chamber 670 are sequentially disposed along the second direction 14. Accordingly, the cleaning chamber 660 and the post-exposure bake chamber 670 are spaced apart from each other in the second direction 14 while the carrying chamber 680 is interposed therebetween. A plurality of cleaning chambers 660 are provided, and the plurality of cleaning chambers 610 are disposed along the third direction 16 to form different layers. Optionally, a plurality of cleaning chambers 660 may be provided in each of the first direction 12 and the third direction 16. A plurality of post-exposure bake chambers 670 are provided, and the plurality of post-exposure bake chambers 610 are disposed along the third direction 16 to form different layers. Optionally, a plurality of post-exposure bake chambers 670 may be provided in each of the first direction 12 and the third direction 16.

When viewed from the top, the carrying chamber 680 is situated in parallel to the second cooling chamber 540 of the second buffer module 500 in the first direction 12. The carrying chamber 680 has a substantially square or rectangular shape. A post-treatment robot 680 is situated in the carrying chamber 682. The post-treatment robot 682 transports the substrate W between the cleaning chambers 660, the post-exposure bake chambers 670, the second cooling chamber 540 of the second buffer module 500, and a second buffer 730 of the interface module 700, which will be described below. The post-treatment robot 682 provided in the post-treatment module 602 may have the same structure as that of the pre-treatment robot 632 provided in the pre-treatment module 601.

The cleaning chamber 660 cleans the substrate W after the exposure process. The cleaning chamber 660 has a housing 661, a support plate 662, and a nozzle 663. The housing 661 has an open-topped cup shape. The support plate 662 is situated in the housing 661, and supports the substrate W. The support plate 662 may be provided to be rotatable. The nozzle 663 supplies a cleaning liquid onto the substrate W positioned on the support plate 662. The cleaning liquid may be water such as deionized water. The cleaning chamber 660 supplies a cleaning liquid to a central area of the substrate W while rotating the substrate W positioned on the support plate 662. Optionally, the nozzle 663 may be linearly moved or rotated from a central area to a peripheral area of the substrate W while the substrate W is rotated.

After the exposure process, the bake chamber 670 heats the substrate W, on which the exposure process has been performed, by using a far infrared ray. After the exposure process, in the bake process, the substrate W is heated to finish a property change of the photoresist by amplifying acid produced in the photoresist through the exposure process. After the exposure process, the bake chamber 670 has a heating plate 672. The heating plate 672 is provided with a heating unit 674 such as a heating wire or a thermoelectric element. After the exposure process, the bake chamber 670 may be further provided with a cooling plate 671 in the interior thereof. The cooling plate 671 is provided with a cooling unit 673 such as cooling water or a thermoelectric element. Optionally, a bake chamber having only a cooling plate 671 may be further provided.

As described above, the pre/post-exposure module 600 is provided such that the pre-treatment module 601 and the post-treatment module 602 are completely separated from each other. The carrying chamber 630 of the pre-treatment module 601 and the carrying chamber 680 of the post-treatment module 602 may have the same size, and may completely overlap each other when viewed from the top. The protective film applying chamber 610 and the cleaning chamber 660 may have the same size, and may completely overlap with each other when viewed from the top. The bake chamber 620 and the post-exposure chamber 670 may have the same size, and may completely overlap with each other when viewed from the top.

The interface module 700 feeds the substrate W between the pre/post-exposure module 600 and the exposure apparatus 900. The interface module 700 has a frame 710, a first buffer 720, a second buffer 730, and an interface robot 740. The first buffer 720, the second buffer 730, and the interface robot 740 are situated within the frame 710. The first buffer 720 and the second buffer 730 are spaced apart from each other by a predetermined distance, and may be stacked. The first buffer 720 is disposed at a location higher than the second buffer 730. The first buffer 720 is situated at a height corresponding to the pre-treatment module 601, and the second buffer 730 is disposed at a height corresponding to the post-treatment module 602. When viewed from the top, the first buffer 720 is disposed along the first direction 12 while forming a row with the carrying chamber 630 of the pre-treatment module 601, and the second buffer 730 is disposed along the first direction 12 forming a row with the carrying chamber 630 of the post-treatment module 602.

The interface robot 740 is situated to be spaced apart from the first buffer 720 and the second buffer 730 in the second direction 14. The interface robot 740 transports the substrate W between the first buffer 720, the second buffer 730, and the exposure apparatus 900. The interface robot 740 has a structure that is substantially similar to that of the second buffer robot 560.

The first buffer 720 temporarily preserves the substrates W, on which the pre-treatment module 601 has performed a process, before they are moved to the exposure apparatus 900. The second buffer 730 temporarily preserves the substrates W, on which the exposure apparatus 900 has completely performed a process, before they are moved to the post-treatment module 602. The first buffer 720 has a housing 721 and a plurality of supports 722. The supports 722 are disposed within the housing 721, and are spaced apart from one another along the third direction 16. One substrate W is positioned on each of the supports 722. The housing 721 has openings (not illustrated) on a side on which the interface robot 740 is provided and on a side on which the pre-treatment robot 632 is provided so that the interface robot 740 and the pre-treatment robot 632 carry a substrate W into or out of the support 722. The second buffer 730 has a structure that is substantially similar to that of the first buffer 720. Meanwhile, the housing 4531 of the second buffer 730 has openings on a side on which the interface robot 740 is provided and on a side on which the post-treatment robot 682 is provided. The interface module may be provided only with buffers and a robot as described above while a chamber that performs a certain process on a substrate is not provided.

Next, an example of performing a process by using the aforementioned substrate treating facility 1 will be described.

The cassette 20, in which substrates W are received, is positioned on the carrier 120 of the load port 100. The door of the cassette 20 is opened by a door opener. The index robot 220 extracts a substrate W from the cassette 20 and transports the substrate W to the second buffer 330.

The first buffer robot 360 transports the substrate W preserved in the second buffer 330 to the first buffer 320. The application robot 432 extracts the substrate W from the first buffer 320, and transports the substrate W to the bake chamber 420 of the application module 401. The bake chamber 420 sequentially performs a prebake process and a cooling process. The application robot 432 extracts the substrate W from the bake chamber 420 and transports the substrate W to the resist applying chamber 410. The resist applying chamber 410 applies a photoresist onto the substrate W. Thereafter, if the photoresist is applied onto the substrate W, the application robot 432 transports the substrate W from the resist applying chamber 410 to the bake chamber 420. The bake chamber 420 performs a soft bake process on the substrate W.

The application robot 432 extracts the substrate W from the bake chamber 420, and transports the substrate W to the first cooling chamber 530 of the second buffer module 500.

The first cooling chamber 530 performs a cooling process on the substrate W. The substrate W, on which the first cooling chamber 530 has performed a process, is transported to the edge exposing chamber 550 by the second buffer robot 560. The edge exposing chamber 550 performs a process of exposing a peripheral area of the substrate W. The substrate W, on which the edge exposing chamber 550 has completely performed a process, is transported to the buffer 520 by the second buffer robot 560.

The pre-treatment robot 632 extracts the substrate W from the buffer 520, and transports the substrate W to the protective film applying chamber 610 of the pre-treatment module 601. The protective film applying chamber 610 applies a protective film onto the substrate W. Thereafter, the pre-treatment robot 632 transports the substrate W from the protective film applying chamber 610 to the bake chamber 620. The bake chamber 620 performs a heat-treatment process such as heating and cooling on the substrate W.

The pre-treatment robot 632 extracts the substrate W from the bake chamber 620, and transports the substrate W to the first buffer 720 of the interface module 700. The interface robot 740 transports the substrate W from the first buffer 720 to a reversal unit 780. The reversal unit 780 reverses the substrate W such that a first surface (pattern surface) of the substrate W faces the lower side. The reversed substrate W is loaded onto the spin chuck, and the loaded substrate W is chucked by the pin members.

An inert gas such as a nitrogen gas is ejected to the first surface of the substrate W, and then a rinsing liquid such as deionized water is ejected to the first surface of the substrate W. The rinsing liquid may be ejected to the first surface of the substrate W together with the gas. When the gas and/or the rinsing liquid are ejected to the first surface of the substrate W, the substrate W may be rotated or not rotated. The rinsing liquid may be ejected to a second surface of the substrate W.

Thereafter, after being transported from the reversal unit 780 to the first buffer 720 by the interface robot 740, the substrate W is transported from the first buffer 720 to the exposure apparatus 900. The exposure apparatus 900 performs an exposure process, for example, an immersion/exposure process on the first surface of the substrate W. If the exposure apparatus 900 completely performs the exposure process on the substrate W, the interface robot 740 transports the substrate W to the second buffer 730 in the exposure apparatus 900.

The post-treatment robot 682 extracts the substrate W from the second buffer 730, and transports the substrate W to the cleaning chamber 660 of the post-treatment module 602. The cleaning chamber 660 performs a cleaning process by supplying a cleaning liquid to a surface of the substrate W. If the cleaning process for the substrate W using the cleaning liquid is completed, the post-treatment robot 682 immediately extracts the substrate W from the cleaning chamber 660, and transports the substrate W to the bake chamber 670 after the exposure process. After the exposure process, the cleaning liquid attached on the substrate W is eliminated by heating the substrate W with the heating plate 672 of the bake chamber 670 and the acid produced in the photoresist is amplified at the same time to finish a property change of the photoresist. The post-treatment robot 682 transports the substrate W from the bake chamber 670 to the second cooling chamber 540 of the second buffer module 500 after the exposure process. The second cooling chamber 540 performs a cooling process on the substrate W.

The development robot 482 extracts the substrate W from the second cooling chamber 540, and transports the substrate W to the bake chamber 470 of the development module 402. The bake chamber 470 sequentially performs a post-bake process and a cooling process. The development robot 482 extracts the substrate W from the bake chamber 470 and transports the substrate W to the development chamber 460. The development chamber 460 performs a development process by supplying a development liquid onto the substrate W. Thereafter, the development robot 482 transports the substrate W from the development chamber 460 to the bake chamber 470. The bake chamber 470 performs a hard bake process on the substrate W.

The development robot 482 extracts the substrate W from the bake chamber 470, and transports the substrate W to the cooling chamber 350 of the first buffer module 300. The cooling chamber 350 performs a process of cooling the substrate W. The index robot 360 transports the substrate W from the cooling chamber 350 to the cassette 20. Unlike this, the development robot 482 may extract the substrate W from the bake chamber 470 and transports the substrate W to the second buffer 330 of the first buffer module 300, and then the substrate W may be transported to the cassette 20 by the index robot 360.

According to an embodiment of the inventive concept, in the step of diffusing the treatment liquid, the substrate is rotated at a first diffusion speed and then is rotated at a second diffusion speed that is higher than the first diffusion speed. Due to the second diffusion speed, the treatment liquid can be diffused at a locus that is larger than that at the first diffusion speed so that a large amount of the treatment liquid is supplied to a peripheral area of the substrate.

Furthermore, according to an embodiment of the inventive concept, the reflow step is performed after the first diffusion step so that the treatment liquid is moved towards the center of the substrate. Thereafter, the treatment liquid can be applied onto the substrate again by performing the second diffusion step, and the thickness of the photosensitive film can be adjusted.

While the inventive concept has been described with reference to embodiments, it will be apparent to those skilled in the art that various changes and modifications may be made without departing from the spirit and scope of the inventive concept. Therefore, it should be understood that the above embodiments are not limiting, but illustrative.

While the inventive concept has been described with reference to embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A method for treating a substrate, the method comprising:
   supplying a treatment liquid for forming a liquid film on the substrate while rotating the substrate at one or more supply speeds;
   stopping the supplying the treatment liquid after reducing the one or more supply speeds to an intermediate supply speed during an intermediate operation, the intermediate operation occurring between the supplying of the treatment liquid and diffusion of same; and
   diffusing the treatment liquid discharged to the substrate by rotating the substrate, after the intermediate operation, the diffusing including,
      rotating the substrate at a first diffusion speed during a primary diffusion operation,
      reflowing the treatment liquid by rotating the substrate at a reflowing speed during a reflow operation, the reflow operation occurring between the primary diffusion operation and a secondary diffusion operation, the reflowing speed being lower than the first diffusion speed, and
      rotating the substrate at a second diffusion speed during the secondary diffusion operation, the second diffusion speed being higher than the first diffusion speed.

2. The method of claim 1, wherein the first diffusion speed is 500 rotations per minute (RPM) to 2000 RPM, and the second diffusion speed is 900 RPM to 3000 RPM.

3. The method of claim 1, wherein the first diffusion speed is 500 RPM to 2000 RPM, the second diffusion speed is 900 RPM to 3000 RPM, and the reflowing speed is 0 RPM to 500 RPM.

4. The method of claim 1, wherein the supplying the treatment liquid comprises:
   supplying the treatment liquid to the substrate while rotating the substrate at a first one of the one or more supply speeds; and
   supplying the treatment liquid to the substrate while rotating the substrate at a second one of the one or more supply speeds, the second one of the one or more supply speeds being less than the first one of the one or more supply speeds.

5. The method of claim 4, wherein the first diffusion speed is 500 RPM to 2000 RPM, the second diffusion speed is 900 RPM to 3000 RPM, and the second one of the one or more supply speeds is 50 RPM to 1000 RPM.

6. The method of claim 5, wherein the first diffusion speed and the second diffusion speed are higher than the second one of the one or more supply speeds.

7. The method of claim 1, wherein supplying the treatment liquid comprises:
   supplying the treatment liquid to the substrate while rotating the substrate at a first one of the one or more supply speeds; and
   supplying the treatment liquid to the substrate while rotating the substrate at a one of the one or more supply speeds, the second one of the one or more supply speeds being lower than the first one of the one or more supply speeds, wherein
      the first diffusion speed and the second diffusion speed are higher than the second one of the one or more supply speeds, the first diffusion speed is 500 RPM to 2000 RPM, the second diffusion speed is 900 RPM to 3000 RPM, the second one of the one or more supply speeds is 50 RPM to 1000 RPM, the intermediate supply speed is 0 RPM to 200 RPM, and the reflow speed is 0 RPM to 500 RPM.

8. The method of claim 4, wherein
   the supplying the treatment liquid while rotating the substrate at the first one of the one or more supply speeds includes supplying the treatment liquid, while a supply location of the treatment liquid is moved from an eccentric location spaced apart from a center of the substrate to the center of the substrate, and
   the supplying the treatment liquid while rotating the substrate at the second one of the one or more supply speeds includes supplying the treatment liquid while the supply location is at the center of the substrate.

9. The method of claim 4, wherein the treatment liquid comprises:
   a photosensitive liquid.

10. A method for treating a substrate, the method comprising:

supplying a treatment liquid for forming a liquid film on the substrate while rotating the substrate at one or more supply speeds;

stopping supplying the treatment liquid after reducing the one or more supply speeds to an intermediate supply speed during an intermediate operation; and diffusing the treatment liquid discharged to the substrate by rotating the substrate, the diffusing including, rotating the substrate at a first diffusion speed during a primary diffusion operation, reflowing the treatment liquid by rotating the substrate at a reflowing speed during a reflow operation, the reflowing speed being lower than the first diffusion speed, and rotating the substrate at a second diffusion speed, the second diffusion speed is higher than the first diffusion speed, wherein the first diffusion speed is 500 rotations per minute (RPM) to 2000 RPM, the second diffusion speed is 900 RPM to 3000 RPM, and the reflowing speed is between 0 RPM to 500 RPM.

11. The method of claim 10, wherein the supplying a treatment liquid comprises:

supplying a photosensitive liquid to the substrate while rotating the substrate at a first one of the supply speeds in a first supply operation; and supplying the photosensitive liquid to the substrate while rotating the substrate at a second one of the supply speeds in a second supply operation, the second one of the supply speeds being lower than the first one of the supply speeds, the first diffusion speed, and the second diffusion speed.

12. The method of claim 11, wherein the second one of the supply speeds is 50 RPM to 1000 RPM, and the intermediate supply speed is 0 RPM to 200 RPM.

13. The method of claim 11, wherein in the first supply operation, the photosensitive liquid is supplied while a supply location of the photosensitive liquid is moved from an eccentric location spaced apart from a center of the substrate to the center of the substrate, and in the second supply operation, the photosensitive liquid is supplied to the center of the substrate.

14. The method of claim 1, wherein the diffusion further includes:

reflowing the treatment liquid by rotating the substrate at second reflowing speed during a second reflow operation, the second reflow operation occurring between the secondary diffusion operation and a third diffusion operation, the second reflowing speed being lower than the first diffusion speed, and rotating the substrate at a third diffusion speed during the third diffusion operation.

15. The method of claim 10, wherein the diffusion further includes:

reflowing the treatment liquid by rotating the substrate at second reflowing speed during a second reflow operation, and rotating the substrate at a third diffusion speed during a third diffusion operation.

* * * * *